United States Patent
Corsi et al.

(10) Patent No.: US 7,782,096 B2
(45) Date of Patent: Aug. 24, 2010

(54) TRACK-AND-HOLD CIRCUIT WITH LOW DISTORTION

(75) Inventors: Marco Corsi, Parker, TX (US); Robert Payne, Lucas, TX (US)

(73) Assignee: Texas Instruments Incorporated, Dallas, TX (US)

(*) Notice: Subject to any disclaimer, the term of this patent is extended or adjusted under 35 U.S.C. 154(b) by 149 days.

(21) Appl. No.: 11/876,943

(22) Filed: Oct. 23, 2007

(65) Prior Publication Data

US 2009/0039923 A1 Feb. 12, 2009

Related U.S. Application Data

(60) Provisional application No. 60/954,689, filed on Aug. 8, 2007.

(51) Int. Cl.
*H03K 5/00* (2006.01)
(52) U.S. Cl. .......................... 327/91; 327/94
(58) Field of Classification Search .................. 327/91, 327/94, 96, 109, 112, 551, 552
See application file for complete search history.

(56) References Cited

U.S. PATENT DOCUMENTS

| | | | |
|---|---|---|---|
| 5,047,666 A | | 9/1991 | Astegher |
| 5,313,113 A | | 5/1994 | Linder |
| 5,467,035 A | * | 11/1995 | Ohi et al. ............ 327/94 |
| 5,471,162 A | | 11/1995 | McEwan |
| 6,028,459 A | * | 2/2000 | Birdsall et al. ........ 327/94 |
| 6,084,480 A | * | 7/2000 | Uneme ................. 331/17 |
| 6,281,717 B1 | | 8/2001 | Thomas |
| 6,323,700 B2 | * | 11/2001 | Hoogzaad ............ 327/108 |
| 6,489,814 B2 | | 12/2002 | Hoogzaad et al. |
| 6,825,697 B1 | * | 11/2004 | Linder et al. .......... 327/94 |
| 6,943,593 B2 | * | 9/2005 | Draxelmayr .......... 327/91 |
| 7,057,450 B2 | * | 6/2006 | Koike ................. 327/552 |
| 7,088,148 B2 | * | 8/2006 | Devendorf et al. ...... 327/94 |
| 7,248,082 B2 | * | 7/2007 | Nakasha et al. ........ 327/91 |

* cited by examiner

*Primary Examiner*—Hai L Nguyen
(74) *Attorney, Agent, or Firm*—John J. Patti; Wade J. Brady, III; Frederick J. Telecky, Jr.

(57) ABSTRACT

A track-and-hold circuit capable of tracking an analog input signal and holding a sampled voltage of the analog input signal at a sampling instant for processing by other circuitry, in response to a track signal that alternates with a hold signal. A first capacitor is provided, having a first terminal connected to a power supply terminal. Tracking circuitry operates when in an on state to apply through a resistor a tracking voltage to a second terminal of the first capacitor that corresponds to the voltage of the analog input signal, by applying the tracking voltage to a first terminal of the resistor, the second terminal of the resistor being connected to the second terminal of the first capacitor. A switch, responsive to the track signal and the hold signal, operates to switch the tracking circuitry to an on state in response to the track signal and to an off state in response to the hold signal, the time of change from the track signal to the hold signal comprising the sampling instant. A second capacitor is provided, having a first terminal connected to the first terminal of the resistor and having a second terminal connected to a power supply terminal. The second capacitor substantially reduces frequency-dependent harmonic distortion.

14 Claims, 4 Drawing Sheets

TRACK-AND-HOLD CIRCUIT WITH LOW DISTORTION

TECHNICAL FIELD OF THE INVENTION

The present invention relates to track and hold circuits, and more particularly relates to a method for improving the performance of such circuits.

BACKGROUND OF THE INVENTION

High-speed, low-power analog-to-digital converters (ADCs) are widely used in numerous applications, for example in portable wireless communications devices. The general architecture of a typical ADC is shown in FIG. 3. An analog input signal $I_A$ is provided to a track-and-hold (or, sample-and-hold) circuit that receives $I_A$ and samples the voltage of that signal at regular intervals. These sample voltages are each held for a period, and provided serially to form an output signal $I_S$ that is provided as an output of the track-and-hold circuit and as an input to the following stage, a quantizer. The quantizer converts the values of the voltage levels of $I_S$ to a digital signal, that it outputs as $O_D$.

The requirement for ever improved performance in the commercial world of technology results in a corresponding demand for ever improved performance of ADCs. Generally, the performance of high-speed ADC is limited by the performance of its track-and-hold circuit. U.S. Pat. No. 6,489,814, which issued on Dec. 3, 2002, to Gian Hoogzaad et al., discloses an exemplary prior art track-and-hold circuit that attempts to reduce excess currents flowing onto the hold capacitor using a feedback connection. However, prior art track-and-hold circuits still suffer from problems such as harmonic distortion, that adversely affects performance of the ADC.

There is thus a need for a way of improving the performance of ADC track-and-hold circuits.

SUMMARY OF THE INVENTION

The following summary presents a simplified description of the invention, and is intended to give a basic understanding of one or more aspects of the invention. It does not provide an extensive overview of the invention, nor, on the other hand, is it intended to identify or highlight key or essential elements of the invention, nor to define the scope of the invention. Rather, it is presented as a prelude to the Detailed Description, which is set forth below, wherein a more extensive overview of the invention is presented. The scope of the invention is defined in the Claims, which follow the Detailed Description, and this section in no way alters or affects that scope.

The present invention is a track-and-hold circuit capable of tracking an analog input signal and holding a sampled voltage of the analog input signal at a sampling instant for processing by other circuitry, in response to a track signal that alternates with a hold signal. A first capacitor is provided, having a first terminal connected to a power supply terminal. Tracking circuitry operates when in an on state to apply through a resistor a tracking voltage to a second terminal of the first capacitor that corresponds to the voltage of the analog input signal, by applying the tracking voltage to a first terminal of the resistor, the second terminal of the resistor being connected to the second terminal of the first capacitor. A switch, responsive to the track signal and the hold signal, operates to switch the tracking circuitry to an on state in response to the track signal and to an off state in response to the hold signal, the time of change from the track signal to the hold signal comprising the sampling instant. A second capacitor is provided, having a first terminal connected to the first terminal of the resistor and having a second terminal connected to a power supply terminal. The second capacitor substantially reduces frequency-dependent harmonic distortion.

These and other aspects and features of the invention Will be apparent to those skilled in the art from the following detailed description of the invention, taken together with the accompanying drawings.

DETAILED DESCRIPTION OF THE PREFERRED EMBODIMENT

The making and use of the various embodiments are discussed below in detail. However, it should be appreciated that the present invention provides many applicable inventive concepts which can be embodied in a wide variety of specific contexts. The specific embodiments discussed are merely illustrative of specific ways to make and use the invention, and do not limit the scope of the invention.

Figure 1A:
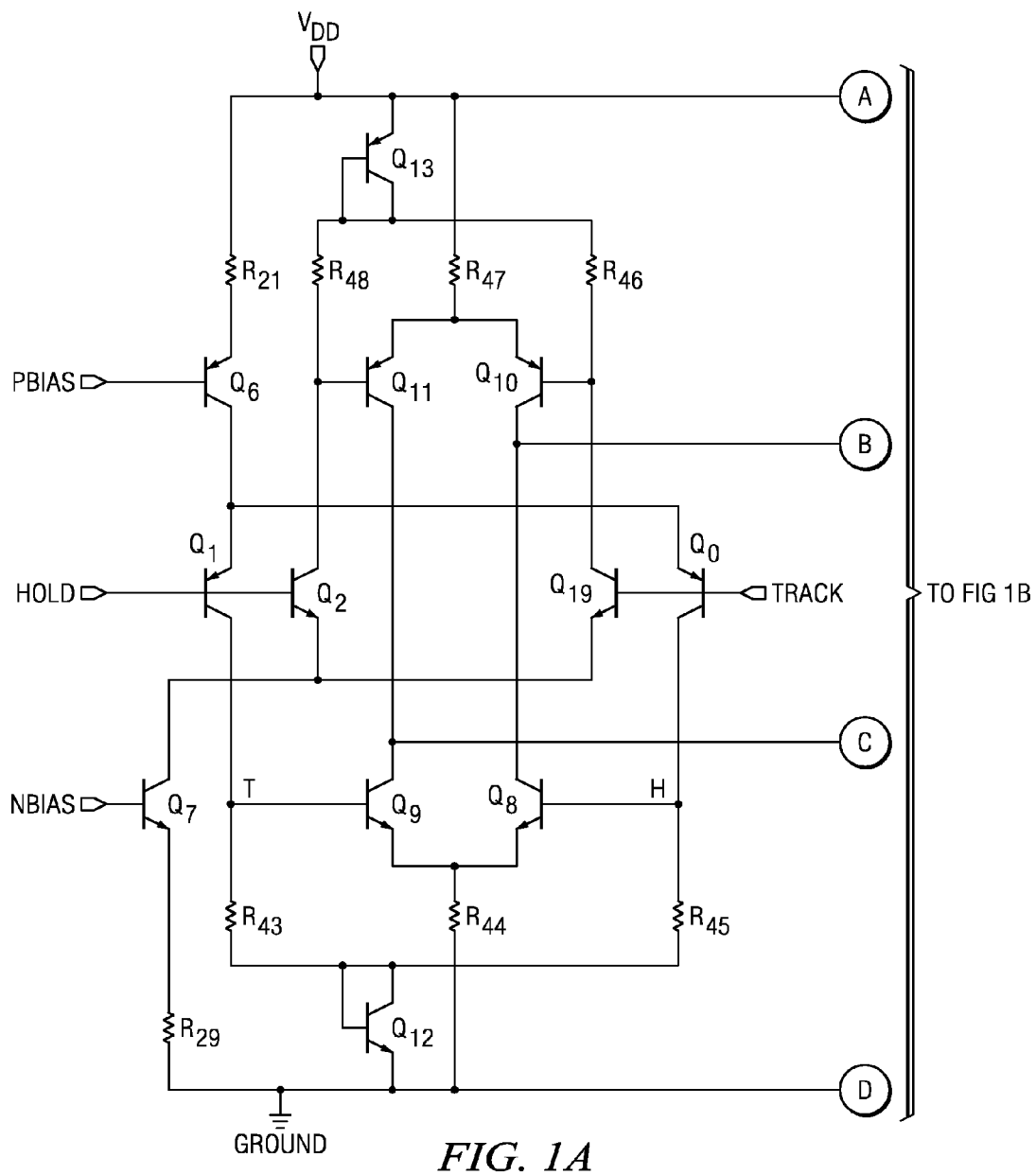
FIG. 1A is a circuit diagram of a first portion of an example of a prior art sample-and-hold circuit.
Figure 1B:
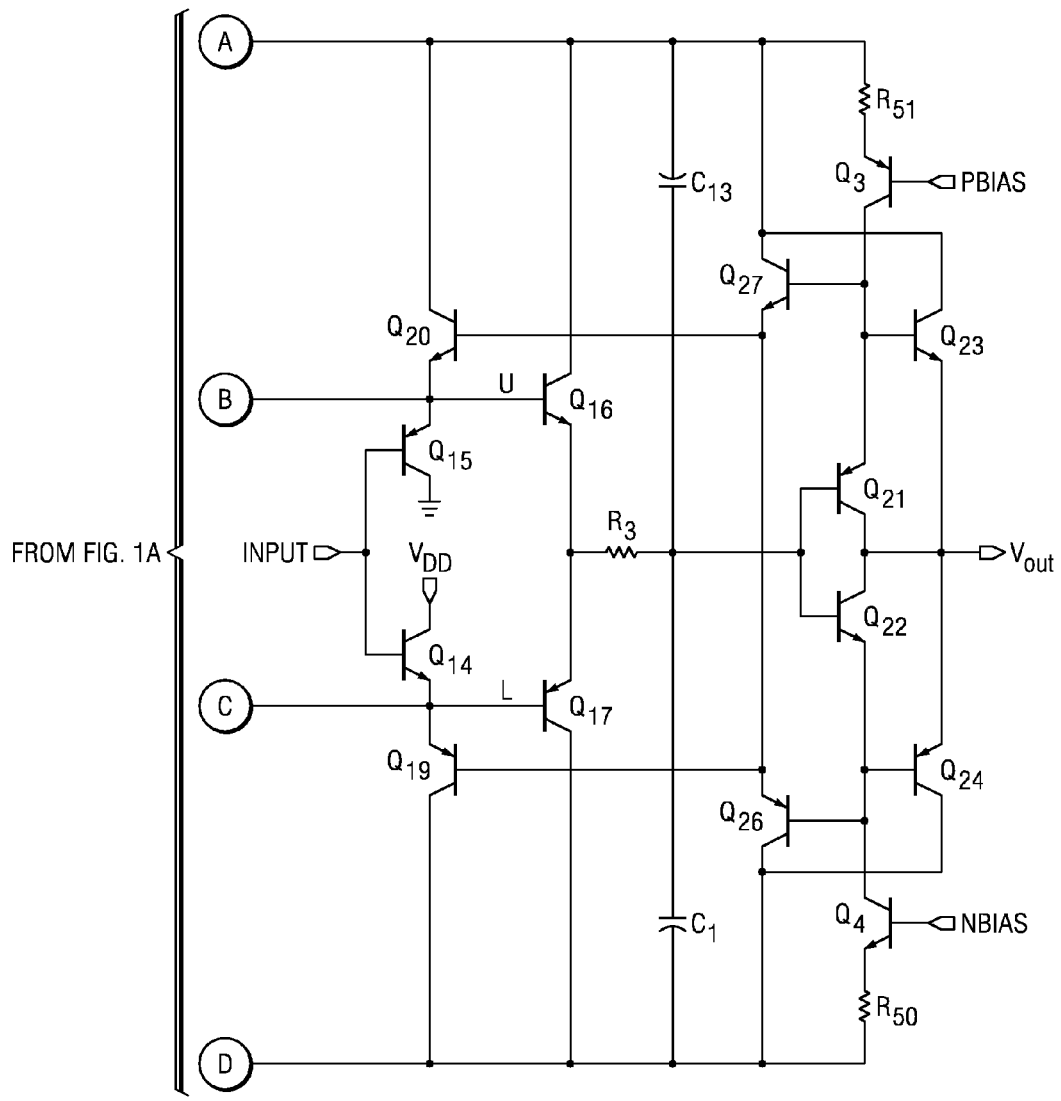
FIG. 1B is a circuit diagram of a second portion of the sample-and-hold circuit of FIG. 1A.

FIGS. 1A and 1B show a circuit diagram of an example of a prior art sample-and hold circuit. The circuit is powered by a power supply providing a source voltage VDD at a VDD node or terminal, and a current return ground at a GROUND node or terminal. Referring to FIG. 1A, a PNP bipolar transistor Q6 has its emitter connected to VDD through a resistor R21, receiving a positive bias voltage from node PBIAS at its base. The collector of transistor Q6 is connected to the emitter of a PNP bipolar transistor Q1 and to the emitter of a PNP bipolar transistor QO. A diode-connected PNP bipolar transistor Q13 has its emitter connected to VDD, and its base and collector connected to one terminal of a resistor R46 and to one terminal of a resistor R48. The other end of resistor R48 is connected to the base of a PNP bipolar transistor Q11 and to the collector of an NPN bipolar transistor Q2. The other end of resistor R46 is connected to the base of a PNP bipolar transistor Q10 and to the collector of an NPN bipolar transistor Q19. The emitters of transistors Q10 and Q11 are connected to VDD through a resistor R47. The collector of transistor Q11 is connected to the collector of an NPN bipolar transistor Q9, and to a connection identified as "C" to the circuitry shown in FIG. 1B. The collector of transistor Q10 is connected to the collector of an NPN bipolar transistor Q8, and to a connection identified as "B" to the circuitry shown in FIG. 1B.

An NPN bipolar transistor Q7 has its emitter connected to GROUND through a resistor R29, receiving a negative bias voltage from node NBIAS at its base. The collector of transistor Q7 is connected to the emitter of transistor Q2 and to the emitter of transistor Q19. A diode-connected NPN bipolar transistor Q12 has its emitter connected to GROUND, and its base and collector connected to one terminal of a resistor R43 and to one terminal of a resistor R45. The other end of resistor R43 is connected to the base of transistor Q9 and to the collector of transistor Q1. The other end of resistor R45 is connected to the base of transistor Q8 and to the collector of transistor Q0. The emitters of transistors Q8 and Q9 are connected to GROUND through a resistor R44. The base of transistor Q1 and the base of transistor Q2 are connected together and to a HOLD node receiving a HOLD signal. The base of transistor Q0 and the base of transistor Q19 are connected together and to a TRACK node receiving a TRACK signal. The power supply node VDD connects to the circuitry of FIG. 1B by way of a connection identified as "A", while the GROUND node connects to the circuitry of FIG. 1B by way of a connection identified as "D".

Referring to FIG. 1B, the collector of an NPN bipolar transistor Q20 is connected to VDD, as is the collector of an NPN bipolar transistor Q16. The emitter of transistor Q20 is connected to the emitter of a PNP bipolar transistor Q15, which has its collector connected to GROUND. The collector of a PNP bipolar transistor Q19 is connected to GROUND, as is the collector of a PNP bipolar transistor Q17. The emitter of transistor Q19 is connected to the emitter of an NPN bipolar transistor Q14, which has its collector connected to VDD. The base of transistor Q14 and the base of transistor Q15 are both connected together and to an INPUT node to which an INPUT signal is applied, which is an analog input signal to be digitized.

The base of transistor Q16 is connected to receive connection "B" from the circuitry of FIG. 1A, while the base of transistor Q17 is connected to receive connection "C" from the circuitry of FIG. 1A. The emitters of transistors Q16 and Q17 are connected together and to a terminal of a resistor R3. The other terminal of resistor R3 is connected to the common connection node of terminals of a capacitor C1 and a capacitor C13. The other terminal of capacitor C1 is connected to GROUND, while the other terminal of capacitor C13 is connected to VDD. The common connection node of resistor R3 and capacitors C1 and C13 is connected to the common connection node of the base of a PNP bipolar transistor Q21 and the base of an NPN bipolar transistor Q22. The emitter of transistor Q21 is connected to the base of an NPN bipolar transistor Q27 and to the base of an NPN bipolar transistor Q23, and to the collector of a PNP transistor Q3. The base of transistor Q3 is connected to PBIAS, while its emitter is connected to VDD through a resistor R51. The emitter of transistor Q27 is connected to the base of transistor Q20, to the base of transistor Q19 and to the emitter of a PNP transistor Q26. The collector of transistor Q27 is connected to VDD and to the collector of transistor Q23. The emitter of transistor Q22 is connected to the base of a PNP bipolar transistor Q26 and to the base of a PNP bipolar transistor Q24, and to the collector of an NPN transistor Q4. The base of transistor Q4 is connected to NBIAS, while its emitter is connected to VDD through a resistor R50. The collector of transistor Q26 is connected to GROUND and to the collector of transistor Q24. The emitters of transistors Q23 and Q24 are connected together and to the collectors of transistors Q21 and Q22, the common connection of all of which forming the output node VOUT.

Referring now back to FIG. 1A, in operation, transistor Q6, which is set using the value of PBIAS, functions as a current source, and gets switched to either resistor R43 or resistor R45, depending on the state of signals TRACK and HOLD. Transistor Q7, which is set using the value of NBIAS, functions as a current sink, operating in complementary operation to the current sourcing of transistor Q6. Transistors Q8, Q9, Q10 and Q11 operate in cooperation with transistors Q6 and Q7 as a bi-directional current source to establish a simultaneous current source through connection "B" and current sink through connection "C", or, alternatively, a simultaneous current source through connection "C" and current sink through connection "B".

Thus, during the tracking phase, when the signal TRACK is high, turning transistor Q0 off and transistor Q1 on, the current from transistor Q6 is switched to resistor R43, thus establishing a voltage at node T. This voltage sets up a corresponding current sinking through transistor Q9, and thus through connection "C", while at the same time a current sourcing is set up though transistor Q10, and thus through connection "B", since the high TRACK signal turns on transistor Q19, and, consequently, also turns on transistor Q10.

During the holding phase, when the signal HOLD is high, the reverse occurs. That is, the high HOLD signal turns transistor Q1 off and transistor Q0 on, switching the current from transistor Q6 to resistor R45, thus establishing a voltage at node H. This voltage sets up a corresponding current sinking through transistor Q8, and thus through connection "B", while at the same time a current sourcing is set up though transistor Q11, and thus through connection "C", since the high HOLD signal turns on transistor Q2, and, consequently, also turns on transistor Q11. In general, the circuitry shown in FIG. 1A functions as a current switch, switching current sinking and sourcing between connections "B" and "C" in response to the state of the TRACK and HOLD signals. Also in general, a typical track-and-hold circuit will have some circuitry that has a switching function, in response to the state of the TRACK and HOLD signals, for the signal holding circuitry, which in this embodiment is shown in FIG. 1B.

Referring now back to FIG. 1B, and continuing to describe the operation of the circuit of FIGS. 1A and 1B, during the tracking phase current is sourced on connection "B" and sunk on connection "C", thus turning on transistors Q16 and Q17. Now, transistors Q14, Q15, Q16 and Q17, together form a unity gain amplifier, with the current sourced/sunk via connections "B" and "C", transistors Q19 and Q20 are off. During this tracking phase, the analog INPUT signal is basically buffered in the unity gain amplifier and, since transistors Q16 and Q17 are on, the buffered voltage is transferred to the plates of capacitors C1 and C13 through resistor R3.

During the holding phase current is sourced on connection "C" and sunk on connection "B", thus turning off the unity gain amplifier, as well as transistors Q16 and Q17. These currents flow through transistors Q20 and Q19. Q19 and Q20 act to limit the voltage on the nodes U and L in such a way that the resulting reverse bias of Q16s and Q17s base emitter junction is independent of the incoming signal at the "Input". This helps to preserve the voltage across capacitors C1 and C13 at the time of transition from tracking phase to holding phase. This voltage is buffered in a unity gain output amplifier formed by transistors Q21, Q22, Q23 Q24, Q26 and Q27, and resistors R50 and R51, and provided as an output voltage VOUT to the output node VOUT.

A problem with the sample-and-hold circuit of FIGS. 1A and 1B arises from the use of resistor R3. This resistor is provided in the circuit to limit the noise bandwidth of the unity gain amplifier described above. The transistors of that amplifier, transistors Q14, Q15, Q16 and Q17, have wide bandwidths, and thus are a source of considerable noise. This noise is integrated over the period of the tracking phase by capacitors C1 and C13, and is therefore a significant source of error. Resistor R3 limits the noise bandwidth and thus reduces this error.

Figure 4:
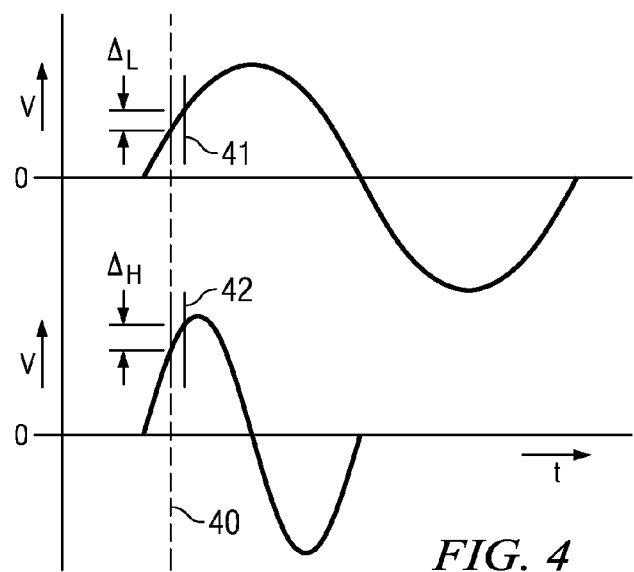
FIG. 4 is a graph of two input signals, showing a sampling instant.

However, resistor R3 introduces another problem. It limits how quickly transistors Q16 and Q17 turn off. This, in turn, produces a signal-dependent sampling instant, which has the effect of introducing an error, namely, harmonic distortion with increasing input frequency. This can be better understood by referring to FIG. 4, which shows two graphs of voltage versus time, time aligned in the figure, one above the other. The top graph shows a plot of one cycle of a low frequency INPUT signal, while the bottom graph shows a plot of one cycle of an INPUT signal having a higher frequency than that of the signal in the top graph. The vertical dashed line 40 represents an instant in time at the transition between a tracking phase and a holding phase. A small vertical line 41 intersects the plot of the low frequency INPUT signal a period of time after the time depicted by the dashed line 40, the period representing the time it takes the transistors Q16 and Q17 of FIG. 1B to turn off. During such period the transistors Q16 and Q17 will continue to conduct, and thus the voltage on capacitors C1 and C13 continue to follow, to some extent, the continued rise of voltage of the INPUT signal. The additional voltage rise during this period is shown in the figure as $\Delta_L$.

A small vertical line 42 intersects the plot of the higher frequency INPUT signal the same period of time after the time depicted by dashed line 40 as in the top graph. Since the frequency is higher than that of the signal in the top graph, the voltage rise during this period is greater, as shown in the graph as $\Delta_H$.

Thus it will be appreciated that this additional voltage component that appears, at least to some extent, on capacitors C1 and C13, has a magnitude that is frequency dependent. This manifests itself in the output signal as harmonic distortion that increases with increasing frequency.

Figure 2:
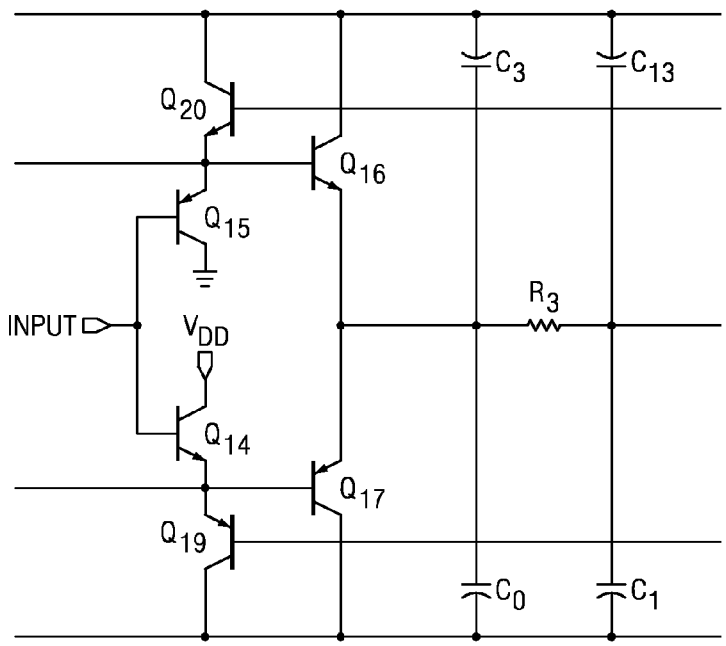
FIG. 2 is a circuit diagram of a preferred embodiment of the present invention.

FIG. 2 is a circuit diagram of a portion of a preferred embodiment of the present invention, corresponding to the unity gain amplifier of FIG. 1B, resistor R3 and capacitors C1 and C13. It can be seen that in the preferred embodiment there are two additional capacitors, capacitors C0 and C3, with capacitor C0 being connected between the connection node of resistor R3 and transistors Q16 and Q17, and GROUND, and capacitor C3 being connected between the connection node of resistor R3 and transistors Q16 and Q17, and VDD. Both capacitor C0 and C3 preferably have a capacitance that is in the range of 10% to 20% of the capacitance of capacitors C1 and C13, although the invention contemplates capacitances outside that range for capacitors C0 and C3.

These additional capacitances provide a relatively low impedance path to help in the discharge of charge in transistors Q16 and Q17 as they turn off, thus significantly shortening the time it takes for them to turn off. By careful selection of the magnitude of their capacitance values, these additional capacitors can be made to have a negligible effect on the noise bandwidth of the unity gain amplifier during the tracking phase.

Figure 3:
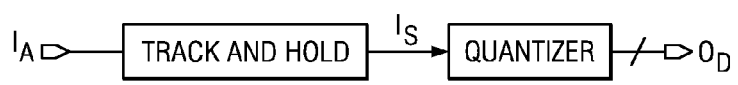
FIG. 3 is a block diagram of the architecture of an ADC.
Figure 5:
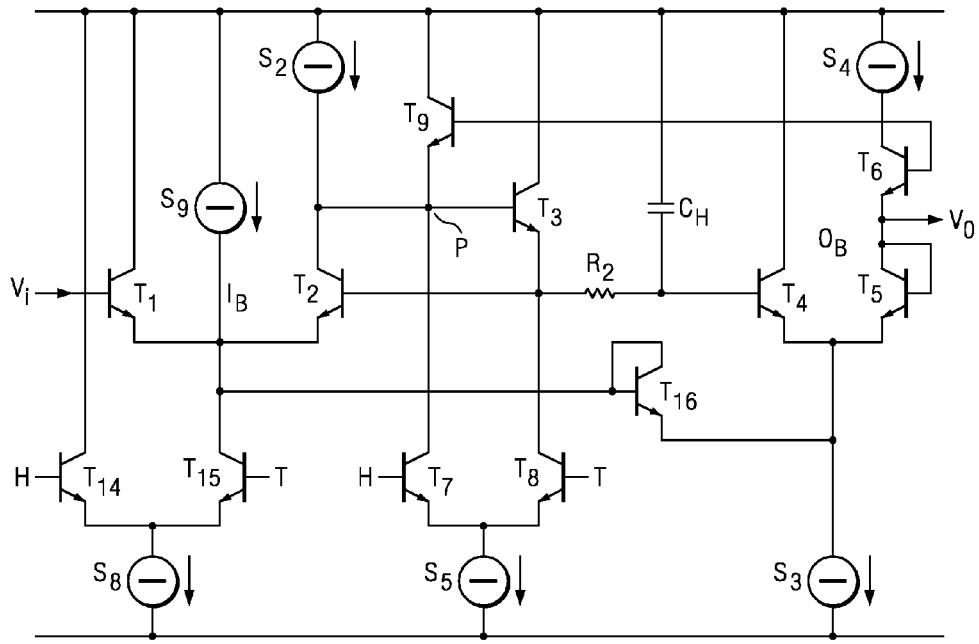
FIG. 5 is an example of a prior art sample-and-hold circuit.
Figure 6:
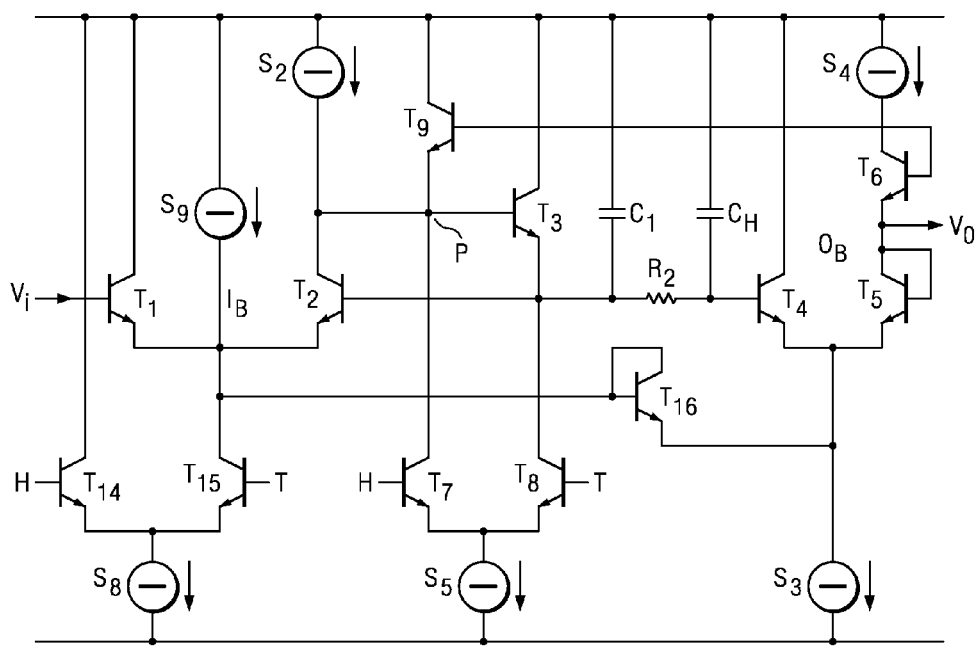
FIG. 6 is a circuit diagram of a preferred embodiment of the present invention.

The invention is applicable to numerous track-and-hold circuit architectures. For example, FIG. 5 is the same as FIG. 3 of the aforementioned U.S. Pat. No. 6,489,814, while FIG. 6 shows the same circuit as that of FIG. 5, but having an additional capacitor $C_I$ added in accordance with the present invention.

Although the present invention and its advantages have been described in detail, it should be understood that various changes, substitutions and alterations can be made herein without departing from the spirit and scope of the invention as defined by the appended claims.

What is claimed is:

1. A track-and-hold circuit capable of tracking an analog input signal and holding a sampled voltage of the analog input signal at a sampling instant for processing by other circuitry, in response to a track signal that alternates with a hold signal, the track-and-hold circuit comprising:

a first capacitor having a first terminal coupled to a power supply terminal;

tracking circuitry operative when in an on state to apply through a resistor a tracking voltage to a second terminal of the first capacitor that corresponds to the voltage of the analog input signal, by applying the tracking voltage to a first terminal of the resistor, the second terminal of the resistor being coupled to the second terminal of the first capacitor;

a switch responsive to the track signal and the hold signal, operative to switch the tracking circuitry to an on state in response to the track signal and to an off state in response to the hold signal, the time of change from the track signal to the hold signal comprising the sampling instant; and a second capacitor having a first terminal coupled to the first terminal of the resistor and having a second terminal coupled to the power supply terminal.

2. The track-and-hold circuit as in claim 1, wherein the second capacitor has a value between 10% and 20% of that of the first capacitor.

3. The track-and-hold circuit as in claim 1, wherein the tracking circuitry comprises a unity gain amplifier.

4. The track-and-hold circuit as in claim 1, wherein the switch comprises circuitry operative to provide current to the tracking circuitry for its operation in response to the track signal, but not to provide such current in response to the hold signal.

5. A track-and-hold circuit capable of tracking an analog input signal and holding a sampled voltage of the analog input signal at a sampling instant for processing by other circuitry, in response to a track signal that alternates with a hold signal, comprising:

a first capacitor having a first terminal coupled to a first power supply terminal;

a second capacitor having a first terminal coupled to a second power supply terminal;

tracking circuitry operative when in an on state to apply through a resistor a tracking voltage to a second terminal of the first capacitor and a second terminal of the second capacitor that corresponds to the voltage of the analog input signal, by applying the tracking voltage to a first terminal of the resistor, the second terminal of the resistor being coupled to the second terminal of the first capacitor;

a switch responsive to the track signal and the hold signal, operative to switch the tracking circuitry to an on state in response to the track signal and to an off state in response to the hold signal, the time of change from the track signal to the hold signal comprising the sampling instant;

a third capacitor having a first terminal coupled to the first terminal of the resistor and having a second terminal coupled to the first power supply terminal; and a fourth capacitor having a first terminal coupled to the first terminal of the resistor and having a second terminal coupled to the second power supply terminal.

6. The track-and-hold circuit as in claim 5, wherein the first and second capacitors have substantially the same value, and wherein the third and fourth capacitors have a value between 10% and 20% of that of the first and second capacitors.

7. The track-and-hold circuit as in claim 5, wherein the tracking circuitry comprises a unity gain amplifier.

8. The track-and-hold circuit as in claim 5, wherein the switch comprises circuitry operative to provide current to the tracking circuitry for its operation in response to the track signal, but not to provide such current in response to the hold signal.

9. A track-and-hold circuit comprising:
a first power supply terminal;
a second power supply terminal;
a bi-directional current source that is coupled to each of the first and second voltage supply terminals and that receives a track signal and a hold signal, wherein the bi-directional current source sources and sinks current through a first output node and a second output node based at least in part on the track and hold signals;
a unity gain amplifier that is coupled to first and second output nodes and that receives the analog input signal, wherein the unity gain amplifier has a third output node;
a resistor that is coupled to the third output node;
a first capacitor coupled between the first power supply terminal and the third output node;
a second capacitor coupled between the second power supply terminal and the third output node;
a third capacitor coupled between the first power supply terminal and the resistor; and
a fourth capacitor coupled between the second power supply terminal and the resistor.

10. The track-and-hold circuit as in claim 9, wherein the third and fourth capacitors have substantially the same capacitance and wherein the capacitance of each the first and second capacitors is between 10% and 20% of the capacitance of each of the third and fourth capacitors.

11. The track-and-hold circuit as in claim 9, wherein the bi-directional current source further comprises a differential input circuit that is adapted to receive the track signal and the hold signal and that is coupled to the first and second output nodes.

12. An analog-to-digital converter (ADC) comprising:
a track-and-hold circuit including:
a first power supply terminal;
a second power supply terminal;
a bi-directional current source that is coupled to each of the first and second voltage supply terminals and that receives a track signal and a hold signal, wherein the bi-directional current source sources and sinks current through a first output node and a second output node based at least in part on the track and hold signals;
a unity gain amplifier that is coupled to first and second output nodes and that receives the analog input signal, wherein the unity gain amplifier has a third output node;
a resistor that is coupled to the third output node;
a first capacitor coupled between the first power supply terminal and the third output node;
a second capacitor coupled between the second power supply terminal and the third output node;
a third capacitor coupled between the first power supply terminal and the resistor; and
a fourth capacitor coupled between the second power supply terminal and the resistor; and
a quantizer that is coupled to the track-and-hold circuit.

13. The track-and-hold circuit as in claim 12, wherein the third and fourth capacitors have substantially the same capacitance and wherein the capacitance of each the first and second capacitors is between 10% and 20% of the capacitance of each of the third and fourth capacitors.

14. The track-and-hold circuit as in claim 12, wherein the bi-directional current source further comprises a differential input circuit that is adapted to receive the track signal and the hold signal and that is coupled to the first and second output nodes.

* * * * *